(12) United States Patent
Chun et al.

(10) Patent No.: US 12,408,279 B2
(45) Date of Patent: Sep. 2, 2025

(54) RELEASE LAYER FOR METAL FOIL WITH CARRIER AND METAL FOIL COMPRISING THE SAME

(71) Applicant: YMT CO., LTD., Incheon (KR)

(72) Inventors: Sung Wook Chun, Incheon (KR); Bo Mook Chung, Incheon (KR); Dea Geun Kim, Incheon (KR); Myong Hwan Park, Incheon (KR); Nak Eun Ko, Bucheon-si (KR); Ju Yong Sim, Seoul (KR)

(73) Assignee: YMT CO., LTD., Incheon (KR)

( * ) Notice: Subject to any disclaimer, the term of this patent is extended or adjusted under 35 U.S.C. 154(b) by 122 days.

(21) Appl. No.: 18/271,461

(22) PCT Filed: Dec. 10, 2021

(86) PCT No.: PCT/KR2021/018719
§ 371 (c)(1),
(2) Date: Jul. 9, 2023

(87) PCT Pub. No.: WO2022/124843
PCT Pub. Date: Jun. 16, 2022

(65) Prior Publication Data
US 2024/0138075 A1    Apr. 25, 2024
US 2024/0237229 A9    Jul. 11, 2024

(30) Foreign Application Priority Data

Dec. 10, 2020 (KR) .................. 10-2020-0172171
Dec. 9, 2021 (KR) .................. 10-2021-0175960

(51) Int. Cl.
*H05K 3/38*     (2006.01)
*C09J 7/40*     (2018.01)
*H05K 1/02*     (2006.01)

(52) U.S. Cl.
CPC .............. *H05K 3/382* (2013.01); *C09J 7/401* (2018.01); *C09J 2400/16* (2013.01); *C09J 2400/20* (2013.01); *H05K 1/0237* (2013.01)

(58) Field of Classification Search
CPC ....... H05K 3/382; H05K 1/0237; C09J 7/401; C09J 2400/16; C09J 2400/20
See application file for complete search history.

(56) References Cited

U.S. PATENT DOCUMENTS

2021/0017650 A1*  1/2021  Chun .................. C23C 18/1637

FOREIGN PATENT DOCUMENTS

JP          2001062955 A     3/2001
JP          2001140090 A     5/2001
(Continued)

OTHER PUBLICATIONS

KR-101807453-B1 Machine Translation (Year: 2017).*
International search report of PCT/KR2021/018719, Mar. 17, 2022, English translation.

*Primary Examiner* — Travis M Figg
(74) *Attorney, Agent, or Firm* — STIP Law Group, LLC

(57) ABSTRACT

The present invention relates to a release layer for a metal foil with carrier and a metal foil with carrier including the release layer. The release layer is designed for easy removal of the carrier and includes one or more nitrogenous heterocyclic compounds and one or more inorganic compounds containing at least one metal selected from the group consisting of nickel, molybdenum, cobalt, phosphorus, manganese, and iron.

8 Claims, 3 Drawing Sheets

(56) References Cited

FOREIGN PATENT DOCUMENTS

| | | | | |
|---|---|---|---|---|
| KR | 100869477 | B1 | 11/2008 | |
| KR | 101108991 | B1 | 1/2012 | |
| KR | 101460553 | B1 | 11/2014 | |
| KR | 20150114918 | A | 10/2015 | |
| KR | 101807453 | B1 * | 12/2017 | ............. B32B 15/08 |
| WO | WO-2020101183 | A1 * | 5/2020 | ........... C23C 18/405 |

* cited by examiner

[Fig. 1]
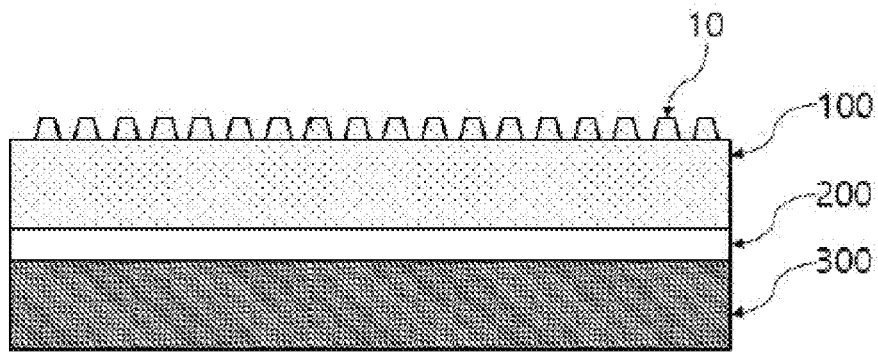
[Fig. 2]
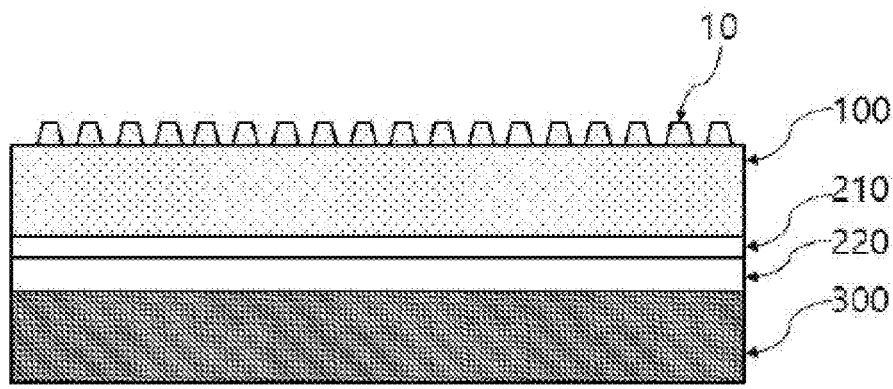
[Fig. 3]
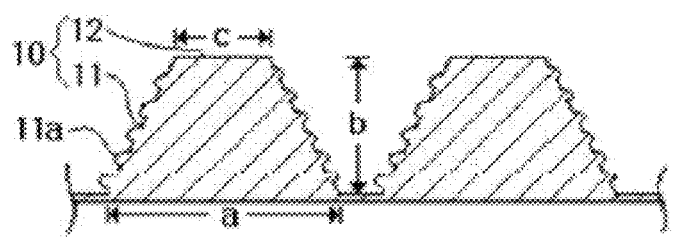

[Fig. 4]
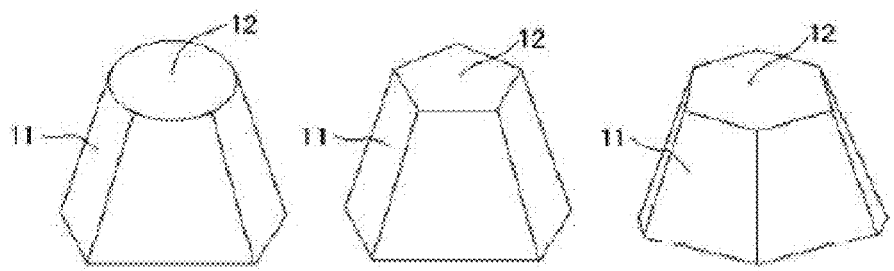
[Fig. 5]
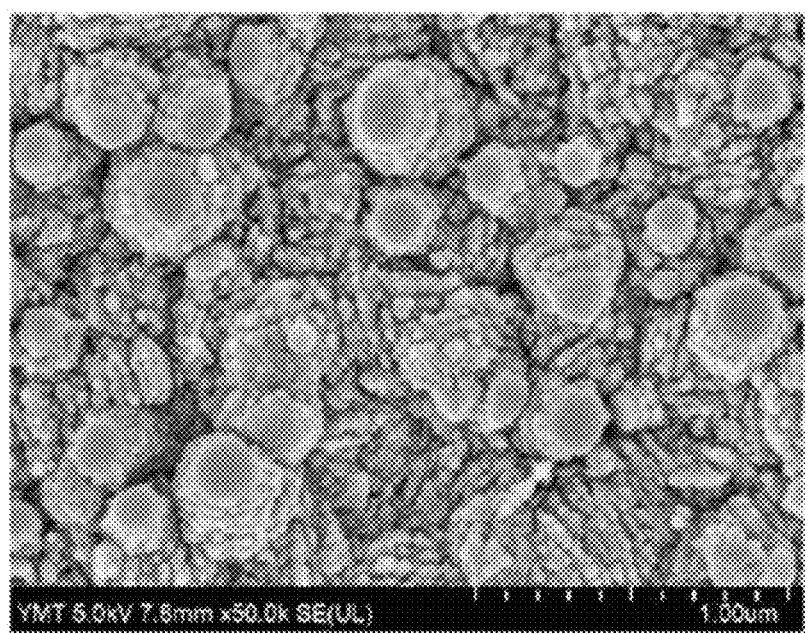

[Fig. 6]
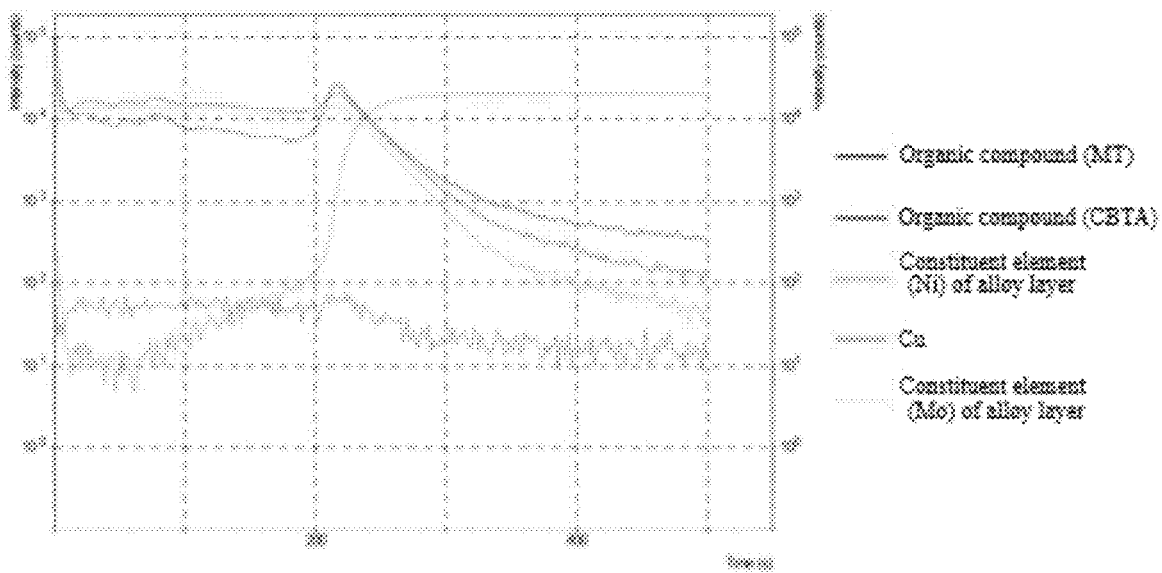
[Fig. 7]
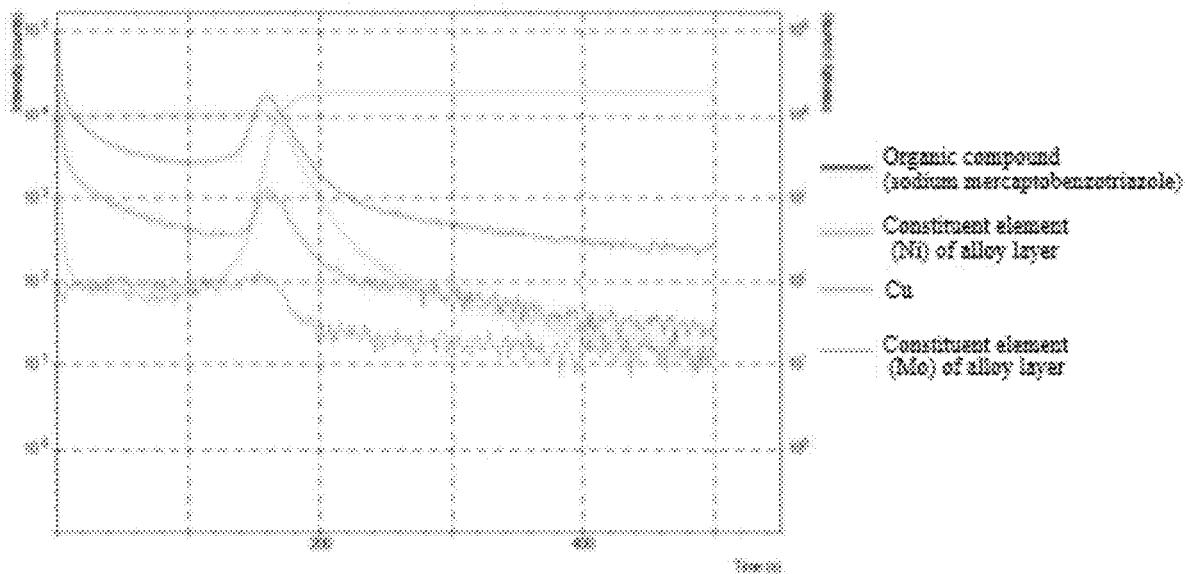

RELEASE LAYER FOR METAL FOIL WITH CARRIER AND METAL FOIL COMPRISING THE SAME

CROSS-REFERENCE TO RELATED APPLICATIONS

This application is the U.S. National Phase under 35 U.S.C. § 371 of International Application No. PCT/KR2021/018719 filed on Dec. 10, 2021, which in turn claims the benefit of Korean Application No. 10-2020-0172171, filed on Dec. 10, 2020, and 10-2021-0175960, filed on Dec. 9, 2021, the disclosures of which are incorporated by reference into the present application.

TECHNICAL FIELD

The present invention relates to a release layer for metal foil with carrier and metal foil comprising the release layer.

BACKGROUND ART

A printed circuit board can be typically manufactured by bonding a metal foil to an insulating resin substrate and etching the metal foil for circuit wiring. A high adhesive strength between the metal foil and the insulating resin substrate is required to prevent the metal foil from being peeled off during circuit wiring.

Various proposals have been made to enhance the adhesion between metal foils and insulating resin substrates. For example, the adhesive strength between a metal foil and an insulating resin substrate is increased by roughening the surface of the metal foil to form irregularities thereon, placing the insulating resin substrate on the irregular surface of the metal foil, and pressing the insulating resin substrate to bond the insulating resin substrate to the metal foil. Specifically, Patent Document 1 discloses a method for enhancing the adhesion between a copper foil and a resin layer by electrolysis, blasting or oxidation-reduction of the surface of the copper foil at the resin layer side to form granular projections.

However, this method has a problem in that the additional roughening of the metal foil deteriorates the manufacturing efficiency of a printed circuit board. Further, the formation of the irregularities on the surface of the metal foil may deteriorate the transmission efficiency of high-frequency signals. With the trend toward higher performance of portable electronic devices, loss of high-frequency signal transmission needs to be minimized in order to rapidly process a large amount of information. However, the irregularities make the surface of the metal foil highly rough and act as obstacles to high-frequency signal transmission, resulting in inefficient high-frequency signal transmission.

On the other hand, the metal foil tends to wrinkle or bend when bonded to an insulating resin substrate or target substrate due to its small thickness. To compensate for this tendency, a release layer and a carrier are bonded to one surface of the metal foil for handling. Here, the metal foil bonded with the release layer and the carrier is required to have good heat resistance when bonded to the insulating resin substrate or target substrate and the carrier is required to be readily peeled off together with the release layer after bonding to the metal foil. In an attempt to meet these requirements, a proposal has been made on a technique wherein an organic component is used in the release layer or an additional layer is provided between the release layer and the metal foil to enhance heat resistance.

The release layer generally consists of two layers: an organic release layer and an inorganic diffusion barrier layer. The multilayer structure incurs a high production cost and is prone to interfacial debonding between the individual layers. Thus, there is a need to develop a new release layer that can eliminate the disadvantages encountered in conventional release layers.

PRIOR ART DOCUMENTS

Patent Documents (0001) Korean Patent No. 10-1460553
(0002) Korean Patent No. 10-0869477

DISCLOSURE OF THE INVENTION

Problems to be Solved by the Invention

The present invention has been made in an effort to solve the above-described problems and intends to provide a release layer for a metal foil with carrier that can serve as both an organic release layer and an inorganic diffusion barrier layer, and a metal foil including the release layer.

The present invention also intends to provide a release layer for a metal foil with carrier that is single-layered such that no interlayer peeling occurs and the production cost and time can be reduced, and a metal foil including the release layer.

Means for Solving the Problems

One aspect of the present invention provides a release layer for a metal foil with carrier designed for easy removal of the carrier and including one or more nitrogenous heterocyclic compounds and one or more inorganic compounds containing at least one metal selected from the group consisting of nickel, molybdenum, cobalt, phosphorus, manganese, and iron.

In one embodiment, the heterocyclic compounds may be selected from the group consisting of benzotriazole, mercaptobenzimidazole, mercaptobenzotriazole, sodium mercaptobenzotriazole, 5-carboxybenzotriazole, 3-amino-5-mercapto-1,2,4-triazole, 3-mercapto-1,2,4-triazole, triazole-5-carboxylic acid, 1-methyl-3-mercapto-1,2,4-triazole, and 1-phenyl-5-mercaptotetrazole.

In one embodiment, the inorganic compounds may be selected from the group consisting of: nickel, molybdenum, cobalt, phosphorus, manganese, and iron sulfates, nitrates, phosphates, hydrochlorides, hydrofluorides, and acetates; and salts derived from nickel, molybdenum, cobalt, phosphorus, manganese, and iron oxides.

In an embodiment, the release layer may have a peel strength of 5 to 50 gf/cm, as evaluated by the IPC-TM-650 test method.

In one embodiment, the release layer may have a thickness of 100 nm to 1 μm.

A further aspect of the present invention provides a metal foil with carrier including the release layer.

In one embodiment, the metal foil with carrier may include a carrier, the release layer formed on the carrier, and a metal layer formed on the release layer wherein the metal layer may include a metal foil having a plurality of flat-topped projections.

In one embodiment, wherein the metal layer comprises an ultrathin layer which is formed on the release layer by electroplating and a metal foil which is formed on the ultrathin layer having a plurality of flat-topped projections is formed.

Effects of the Invention

The formation of the metal foil having a plurality of projections allows the metal foil with carrier of the present invention to have a high adhesive strength to a target substrate (for example, an insulating resin substrate). Due to the high adhesive strength, a decrease in the transmission efficiency of high-frequency signals can be minimized.

In addition, the monolayer structure of the release layer facilitates peeling of the carrier from the metal foil without leaving residual impurities while minimizing deformation of the metal foil, ensuring good heat resistance of the metal foil with carrier.

Furthermore, the present invention can provide a printed circuit board with high transmission efficiency of high-frequency signals that is either based on an insulating resin substrate or is manufactured by a coreless process without using an insulating resin substrate.

BRIEF DESCRIPTION OF THE DRAWINGS

FIG. 1 illustrates a metal foil with carrier including a release layer according to one embodiment of the present invention.

FIG. 2 illustrates a conventional metal foil with carrier including a release layer having two layers.

FIG. 3 illustrates the structure of surface projections of a metal foil according to one embodiment of the present invention.

FIG. 4 illustrates various shapes of projections according to exemplary embodiments of the present invention.

FIG. 5 is a surface SEM image of a metal foil having projections according to one embodiment of the present invention.

FIG. 6 shows the results of TOF-SIMS analysis for a release layer formed in Example 1.

FIG. 7 shows the results of TOF-SIMS analysis for a release layer formed in Comparative Example 1.

DETAILED DESCRIPTION FOR CARRYING OUT THE INVENTION

Preferred embodiments of the present invention will now be described in detail. In the description of the present invention, detailed explanations of related art are omitted when it is deemed that they may unnecessarily obscure the essence of the present invention. Throughout the specification, when a certain portion "comprises (or includes)" a certain component, this indicates that the other components are not excluded and may be further included, unless the context specifically requires otherwise.

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

The present invention is not limited to the illustrated embodiments and may be embodied in various different forms. Rather, the disclosed embodiments are provided so that this disclosure will be thorough and complete, and will fully convey the scope of the invention to those skilled in the art. In the drawings, the dimensions, such as widths and thicknesses, of elements may be exaggerated for clarity. The drawings are explained from an observer's point of view. It will be understood that when an element is referred to as being "on" another element, it can be directly on the other element, or one or more intervening elements may also be present therebetween. It will be understood by those skilled in the art that the present invention may be embodied in various different forms without departing from the spirit and scope of the invention as defined by the appended claims. The same reference numerals represent substantially the same elements throughout the drawings.

Terms used herein are to be understood as described below. While such terms as "first" and "second," etc., may be used to describe various elements, such elements must not be limited to the above terms. The above terms are used only to distinguish one element from another. For example, a first element may be referred to as a second element, and likewise a second element may be referred to as a first element.

As used herein, the singular forms "a", "an" and "the" are intended to include the plural forms as well, unless the context clearly indicates otherwise. It will be further understood that the terms "comprise(s) (or include(s))", "comprising (or including)", "have (has)" and/or "having", when used in this specification, specify the presence of stated features, integers, steps, operations, elements, and/or components, but do not preclude the presence or addition of one or more other features, integers, steps, operations, elements, components, and/or groups thereof. Respective steps of the methods described herein may be performed in a different order than that which is explicitly described. In other words, the respective steps may be performed in the same order as described, simultaneously, or in a reverse order.

As used herein, the term "and/or" encompasses both combinations of the plurality of related items disclosed and any item from among the plurality of related items disclosed. In the present specification, the description "A or B" means "A", "B", or "A and B."

The present invention is directed to a release layer for a metal foil with carrier designed for easy removal of the carrier and including one or more nitrogenous heterocyclic compounds and one or more inorganic compounds containing at least one metal selected from the group consisting of nickel, molybdenum, cobalt, phosphorus, manganese, and iron.

A release layer used in a conventional metal foil with carrier generally consists of an inorganic diffusion barrier layer 220 and an organic release layer 210 (see FIG. 2). Particularly, the inorganic diffusion barrier layer 220 serves as a barrier to the diffusion of a component from a carrier 300 into a metal foil 100 and prevents changes in the physical properties of the metal foil even during long-term storage. However, since the individual layers of the release layer having a multilayer structure are separately formed by transfer or plating, a lot of time is required to form the release layer and interfacial debonding occurs between the individual layers upon release, leaving residue on the metal foil.

In contrast, the release layer 200 of the present invention is designed to simultaneously perform the roles of an inorganic diffusion barrier layer and an organic release layer. Due to this design, the release layer 200 can be formed at low cost in a short time while leaving minimal residue (see FIG. 1).

The presence of the inorganic compounds containing at least one metal as inorganic components and the nitrogenous heterocyclic compounds as organic components allows the release layer 200 to act as both an organic release layer and an inorganic diffusion barrier layer.

The heterocyclic compound refers to a cyclic compound in which one or more atoms in the ring are replaced with atoms other than carbon. The nitrogenous heterocyclic compound used in the present invention is a cyclic compound in which one or more carbon atoms in the ring are replaced with nitrogen atoms.

Specifically, the heterocyclic compounds are cyclic compounds containing two or more nitrogen atoms. More specifically, the heterocyclic compounds are selected from the group consisting of benzotriazole, mercaptobenzimidazole, mercaptobenzotriazole, sodium mercaptobenzotriazole, 5-carboxybenzotriazole, 3-amino-5-mercapto-1,2,4-triazole, 3-mercapto-1,2,4-triazole, triazole-5-carboxylic acid, 1-methyl-3-mercapto-1,2,4-triazole, and 1-phenyl-5-mercaptotetrazole. Due to the presence of the cyclic compounds, the release layer maintains its stable structure and can block interdiffusion between overlying and underlying layers.

The organic components may be used alone or in combination of two or more thereof. The combined use of two or more of the organic components is more preferable in terms of releasability of the release layer. When the two organic components are used, their mixing ratio may be in the range of 1:5 to 5:1. The two organic components are preferably used in the same amounts (i.e. in a ratio of 1:1). If the ratio of the two organic components is outside the range defined above, the effect of mixing the organic components is difficult to expect.

When the release layer 200 is formed by plating, the organic components may be used in a total amount of 0.5 to 5 g per liter (L) of plating solution. If the organic components are used in a total amount less than 0.5 g/L, the peel strength of the release layer 200 may be lowered, resulting in separation of the carrier at an unwanted time. Meanwhile, if the organic components are used in a total amount exceeding 5 g/L, the diffusion barrier effect of the release layer may deteriorate due to the use of the relatively small total amount of the inorganic components for plating.

The inorganic components may contain at least one metal selected from the group consisting of nickel, molybdenum, cobalt, phosphorus, manganese, and iron. The inorganic components prevent a component from the underlying carrier 300 from being diffused into an overlying metal foil 100. Preferably, the inorganic components prevent the diffusion of copper of the underlying carrier 300. Copper is mainly used as a material for the underlying carrier. When the underlying carrier is made of copper and the overlying metal foil is a copper foil, the diffusion of the copper of the underlying carrier into the overlying metal foil may lead to a change in the composition of the metal foil. This diffusion can be prevented by the use of the inorganic components.

Preferably, the inorganic components contain at least one metal selected from the group consisting of nickel, molybdenum, cobalt, phosphorus, manganese, and iron. More preferably, the inorganic components are selected from the group consisting of: nickel, molybdenum, cobalt, phosphorus, manganese, and iron sulfates, nitrates, phosphates, hydrochlorides, hydrofluorides, and acetates; and salts derived from nickel, molybdenum, cobalt, phosphorus, manganese, and iron oxides.

Specific examples of the sulfates include iron sulfate, nickel sulfate, ammonium nickel sulfate, manganese sulfate, molybdenum disulfide, and cobalt sulfate. Specific examples of the nitrates include iron nitrate, nickel nitrate, molybdenum nitrate, cobalt nitrate, and manganese nitrate. Similarly, specific examples of the phosphates include iron phosphate, nickel phosphate, molybdenum phosphate, cobalt phosphate, and manganese phosphate. Specific examples of the hydrochlorides include iron chloride, nickel chloride, molybdenum chloride, cobalt chloride, and manganese chloride. Hydrofluorides and acetates of these metals may also be used as the organic compounds.

The oxide-derived salt is a salt in which sodium, potassium, calcium or magnesium is bonded to a nickel, molybdenum, cobalt, phosphorus, manganese or iron oxide as a base.

The inorganic components may be used alone or in combination of two or more thereof. As in the case of the organic components, a combination of two or more of the inorganic components is more preferably used for the purpose of increasing the diffusion barrier effect of the release layer. Here, when two of the inorganic components are used, they are referred to as a "first component" and a "second component", respectively. Particularly, the use of a nickel-containing compound as the inorganic component can prevent a metal component from the carrier from being diffused above the release layer. Alternatively, a molybdenum-containing compound activates the organic components (i.e. the heterocyclic compounds) to facilitate bonding of the inorganic components to the organic components, leaving minimal residue upon release.

The weight ratio of the first component (a) to the second component (b) may be in the range of 30-80:70-20, specifically 40-70:60-30. Within this range, diffusion of a component from the carrier into the metal layer can be prevented and peeling of the carrier is enabled without leaving impurities in the metal layer. In addition, the release layer can be imparted with a bonding strength (peel strength) required before and after peeling. Furthermore, even when the metal foil with carrier is thermally treated at 200° C. or higher to produce a laminate with a resin substrate for a printed circuit board, the bonding strength (peel strength) between the carrier and the release layer can be maintained at a stable level, ensuring easy peeling of the carrier.

In addition to the two inorganic components, the release layer may further include (c) a third component containing at least one metal selected from the group consisting of cobalt (Co), phosphorus (P), manganese (Mn), and iron (Fe). The presence of the third component can enhance the bonding strength between the inorganic components and the organic components of the release layer while maintaining the bonding strength (peel strength) stable even when the metal foil with carrier is thermally treated at 200° C. or higher. The first component (a), the second component (b), and the third component (c) are present in a weight ratio (a:b:c) of 30-60:25-50:1-40.

When the release layer 200 is formed by plating, the inorganic components may be used in a total amount of 50 to 150 g per liter (L) of plating solution. If the inorganic components are used in a total amount less than 50 g/L, the diffusion barrier effect of the release layer may deteriorate. Meanwhile, if the inorganic components are used in a total amount exceeding 150 g/L, the peel strength of the release layer may be lowered due to the use of the relatively small total amount of the organic components.

The release layer formed using the combination of the organic components and the inorganic components has a thickness of 100 nm to 1 μm, preferably 100 to 500 nm, more preferably 150 to 250 nm. If the release layer has a thickness less than 100 nm, the release layer may be difficult to peel and may fail to prevent the diffusion of a component from the carrier layer. Meanwhile, if the release layer has a thickness exceeding 1 μm, residue may remain upon removal of the carrier layer by the release layer.

The release layer 200 may be formed by electroplating, as described above. The electroplating may be performed with a current density of 2 to 5 ASD for 10 to 60 seconds. If the electroplating is performed with a current density less than 2 ASD or for a time less than 10 seconds, the release layer 200 may become thinner than 100 nm. Meanwhile, if the electroplating is performed with an electric current density exceeding 5 ASD or for a time exceeding 60 seconds, the release layer 200 may become thicker than 1 μm or may be carbonized by the excessively large amount of current.

The release layer 200 may have a peel strength of 5 to 50 gf/cm, as evaluated by the IPC-TM-650 test method. If the peel strength is less than 5 gf/cm, the carrier may be separated during storage or transport. Meanwhile, if the peel strength exceeds 50 gf/cm, residue may be left upon release, causing the formation of defects.

The present invention also provides a metal foil with carrier including the release layer. The release layer may have a monolayer structure, as described above. Due to this structure, the release layer can be formed at a lower cost in a shorter time than that of the conventional metal foil with carrier.

The metal foil with carrier may include a carrier, the release layer formed on the carrier, and a metal layer formed on the release layer wherein the metal layer may include a metal foil having a plurality of flat-topped projections.

The projections 10 may metal crystal particles protruding vertically upward from the surface of the metal foil 100. Specifically, each of the projections 10 may include a protrusion 11 and a plateau 12.

The protrusions 11 of the projections 10 are portions protruding from the surface of the metal foil 100 and may have a truncated cone or polygonal truncated pyramidal shape. Specifically, the protrusions 11 have a truncated cone shape with a flat surface (lateral surface) or a polygonal truncated pyramidal shape with angled surfaces, as illustrated in FIG. 4. This shape can enhance the anchorage of the metal foil to an insulating resin substrate so that the metal foil 100 can be bonded to the insulating resin substrate with a high adhesive strength. More specifically, the protrusions 11 may have at least one polygonal truncated pyramidal shape selected from the group consisting of pentagonal truncated pyramidal, hexagonal truncated pyramidal, heptagonal truncated pyramidal, and octagonal truncated pyramidal shapes.

Each of the protrusions 11 may have a plurality of microprojections 11a to enhance the adhesion to an insulating resin substrate due to its increased surface area. The formation of the microprojections 11a allows the protrusions 11 to have a surface roughness (Ra) of 0.05 to 0.3 specifically 0.08 to 0.2 Here, the surface roughness (Ra) of the protrusions 11 is defined as that of the lateral surfaces of the protrusions 11 other than the plateaus 12.

Meanwhile, the ratio of the height (b) of each protrusion 11 to the length (a) of the base of the protrusion 11 to may be in the range of 0.4:1 to 1.5:1 (b:a), specifically, 0.6:1 to 1.2:1 (b:a). When the ratio (b:a) is within the range defined above, the adhesion between the metal foil 100 and an insulating resin substrate can be enhanced and loss of high-frequency signal transmission can be minimized.

The plateaus 12 of the projections 10 are flat surfaces of the upper ends of the protrusions 11. The plateaus 12 may be upper surfaces of the protrusions 11 having a truncated cone or polygonal truncated pyramidal shape. In the conventional metal foil with carrier, particles protrude sharply or roundly from the surface of the metal foil to form irregularities that make the surface of the metal foil highly rough. The formation of the irregularities can enhance the adhesion to an insulating resin substrate but leads to loss of high-frequency signal transmission. In contrast, in the metal foil with carrier of the present invention, the plateaus 12 forming the top surfaces (top ends) of the projections 10 allow the metal foil 100 to have a relatively low surface roughness due to their flatness. The relatively low surface roughness minimizes loss of high-frequency signal transmission. Specifically, the plateaus 12 may have a circular, elliptical or polygonal shape. Fine irregularities may be densely formed to provide flat surfaces, which can also be considered to be encompassed within the scope of the plateaus 12.

In each of the projections 10, the ratio of the length (c) of the plateau 12 to the length (a) of the base of the protrusion 11 may be in the range of 0.1:1 to 0.7:1, specifically 0.2:1 to 0.6:1. When the ratio (c:a) is within the range defined above, the adhesion between the metal foil 100 and an insulating resin substrate can be enhanced and loss of high-frequency signal transmission can be minimized. The length (c) of the plateau 12 refers to the largest length in the plane of the plateau 12.

The number of the projections 10 per unit area (1 μm$^2$) of the metal foil 100 may be or less, specifically 5 to 20, more specifically 7 to 15, taking into consideration the adhesion between the metal foil 100 and an insulating resin substrate, the transmission efficiency of high-frequency signals, the circuit wire resolution of the metal foil 100, etc.

The projections 10 may be formed by electroless plating. Specifically, the projections 10 can be formed on the surface of the metal foil 100 by forming a metal seed foil by electroless plating, after which crystal grains continuously grow on the metal seed foil. In the conventional metal foil with carrier, irregularities are formed by additional roughening of the metal foil. In contrast, in the metal foil with carrier of the present invention, the plurality of projections 10 naturally form a rough surface in the course of forming the metal foil 100. Thus, the need for additional roughening is avoided, enabling the formation of the metal foil 100 and the manufacture of a printed circuit board with high efficiency. In addition, electroless plating makes the metal foil 100 smaller in thickness and more porous than electroplating.

The composition of an electroless plating solution used to form the metal foil 100 is not particularly limited and may include a metal ion source and a nitrogenous compound.

The metal ion source may be specifically a copper ion source selected from the group consisting of copper sulfate, copper chloride, copper nitrate, copper hydroxide, copper sulfamate, and mixtures thereof. The metal ion source may be present at a concentration of 0.5 to 300 g/L, specifically 100 to 250 g/L, more specifically 190 to 200 g/L.

The nitrogenous compound diffuses metal ions to form the plurality of projections on the surface of a metal seed foil formed by the metal ion source. Specifically, the nitrogenous compound may be selected from the group consisting of purine, adenine, guanine, hypoxanthine, xanthine, pyridazine, methylpiperidine, 1,2-di-(2-pyridyl)ethylene, 1,2-di-(pyridyl)ethylene, 2,2'-dipyridylamine, 2,2'-bipyridyl, 2,2'-bipyrimidine, 6,6'-dimethyl-2,2'-dipyridyl, di-2-furyl ketone, N,N,N',N'-tetraethylenediamine, 1,8-naphthyridine, 1,6-naphthyridine, terpyridine, and mixtures thereof. The nitrogenous compound may be present at a concentration of 0.001 to 1 g/L, specifically 0.01 to 0.1 g/L.

The electroless plating solution may further include one or more additives selected from the group consisting of a chelating agent, a pH adjusting agent, and a reducing agent.

Specifically, the chelating agent may be selected from the group consisting of tartaric acid, citric acid, acetic acid, malic acid, malonic acid, ascorbic acid, oxalic acid, lactic acid, succinic acid, potassium sodium tartrate, dipotassium tartrate, hydantoin, 1-methylhydantoin, 1,3-dimethylhydantoin, 5,5-dimethylhydantoin, nitriloacetic acid, triethanolamine, ethylenediaminetetraacetic acid, tetrasodium ethylenediaminetetraacetate, N-hydroxyethylenediamine triacetate, and pentahydroxypropyldiethylenetriamine, and mixtures thereof. The chelating agent may be present at a concentration of 0.5 to 600 g/L, specifically 300 to 450 g/L, more specifically 400 to 430 g/L.

Specifically, the pH adjusting agent may be selected from the group consisting of sodium hydroxide, potassium hydroxide, lithium hydroxide, and mixtures thereof. The pH adjusting agent can adjust the pH of the electroless plating solution to 8 or higher, specifically to 14, more specifically 11 to 13.5.

Specifically, the reducing agent may be selected from the group consisting of formaldehyde, sodium hypophosphite, sodium hydroxymethanesulfinate, glyoxylic acid, borohydride, dimethylamine borane, and mixtures thereof. The reducing agent may be present at a concentration of 1 to 20 g/L, specifically 5 to 20 g/L.

The conditions for the electroless plating to form the metal foil 100 may be appropriately adjusted depending on the thickness of the metal foil 100. Specifically, the electroless plating temperature may be 20 to 60° C., specifically 25 to 40° C. and the electroless plating time may be 2 to 30 minutes, specifically 5 to 20 minutes.

The thickness of the metal foil 100 formed by electroless plating may be 5 μm or less, specifically 0.1 to 1 as described above. The component of the metal foil 100 is not particularly limited and may be any known metal that can form a circuit layer of a printed circuit board. Specifically, the metal may be selected from the group consisting of copper, silver, gold, nickel, aluminum, and mixtures thereof.

The carrier 300 of the metal foil with carrier according to the present invention serves to prevent the metal layer from being deformed during transport or use of the metal foil with carrier. The carrier 300 is made of a metal such as copper or aluminum. Alternatively, the carrier 300 may be made of a polymer such as polyethylene terephthalate (PET), polyphenylene sulfide (PPS) or Teflon. The thickness of the carrier may be specifically 10 to 50 μm.

The metal foil with carrier of the present invention may further include an anti-rusting layer formed on the metal layer to protect the metal layer from rusting. For example, the anti-rusting layer may include zinc or chromium.

The metal layer may further include an ultrathin layer formed on the release layer. The metal foil having a plurality of flat-topped projections is formed on the ultrathin layer.

That is, the metal layer may consist largely of an ultrathin layer formed on the release layer and the metal foil having a plurality of projections. The ultrathin layer formed on the release layer serves as a base for forming the metal foil thereon. The ultrathin layer may be formed by electroplating.

Specifically, electroplating should be performed to form the metal layer on the release layer. However, since the metal foil is formed by electroless plating, as described above, it may be difficult to directly form the metal layer on the release layer. The formation of the ultrathin layer on the release layer by electroplating facilitates the formation of the metal foil by electroless plating.

For good bonding with the metal foil, the ultrathin layer may include at least one metal selected from the group consisting of copper, silver, gold, nickel, and aluminum. More preferably, the ultrathin layer is formed using the same metal as the metal foil.

The ultrathin layer can be formed by electroplating, as described above. For the electroplating, copper, silver, gold, nickel, and aluminum sulfates may be used as metal ion sources and an aqueous solution containing sulfuric acid may be used as an electrolyte solution.

The electroplating conditions may be appropriately adjusted depending on the thickness of the ultrathin layer. For example, the electroplating may be performed at a temperature of 20 to 30° C. for 1 to 50 seconds. Within these temperature and time ranges, the ultrathin layer may be normally formed. If the temperature and time conditions are below the respective ranges, the ultrathin layer may become excessively thin, making it difficult to form the metal foil. Meanwhile, if the temperature and time conditions are above the respective ranges, the ultrathin layer may become excessively thick, resulting in an increase in overall circuit thickness.

The electroplating for forming the ultrathin layer may be performed with a current density of 1 to 5 ASD. If an electric current is supplied at a density less than 1 ASD, the ultrathin layer may be impossible to form. Meanwhile, if an electric current is supplied at a density exceeding 5 ASD, the ultrathin layer may be oxidized, resulting in the formation of defects.

The metal foil with carrier of the present invention may further include an oxidation barrier layer formed between the release layer and the metal layer. The oxidation barrier layer may include nickel or phosphorus.

The present invention provides a printed circuit board manufactured using the metal foil. Specifically, the printed circuit board of the present invention includes a metal circuit layer and an insulating resin layer. The metal circuit layer is derived from the metal foil, which will be described below.

The metal circuit layer of the printed circuit board is a layer where circuit wires are formed. The metal circuit layer is obtained by forming circuit wires on the metal foil. The metal foil ensures miniaturization and high resolution of the printed circuit board. Specifically, the printed circuit board of the present invention is manufactured by bonding the insulating resin substrate and the metal foil to form a laminate and etching the laminate to form circuit wires on the metal foil. The metal foil is bonded to the insulating resin substrate with a high adhesive strength and has a relatively small thickness, enabling the formation of fine and high-resolution circuit wires thereon. In addition, the circuit wires formed on the metal foil have a high adhesive strength to the insulating resin substrate.

There is no particular restriction on the method for forming the circuit wires. For example, the circuit wires may be formed by a subtractive process, an additive process, a full additive process, a semi-additive process or a modified semi-additive process.

The insulating resin layer of the printed circuit board is an insulating layer formed on the metal circuit layer. The insulating resin layer may be any suitable insulating resin substrate well known in the art. Specifically, the insulating resin layer may be a resin substrate having a structure in which a well-known resin is impregnated into an inorganic or organic fiber. For example, the resin substrate may be a prepreg.

The printed circuit board of the present invention may be manufactured using an insulating resin substrate or by a coreless process without using an insulating resin substrate. The coreless process method is not particularly limited as long as it is well known in the art.

The present invention will be more specifically explained with reference to the following examples. However, these examples are provided for illustrative purposes and are not intended to limit the scope of the present invention. Those skilled in the art will appreciate that various modifications and variations are possible without departing from the scope and spirit of the invention.

Examples 1-15

An about 18 μm thick carrier copper foil was immersed in 5 wt % sulfuric acid for pickling and washed with pure water. The washed carrier foil was electroplated with a plating solution containing nickel sulfate, sodium molybdate, 3-mercapto-1,2,4-triazole (MT), and 5-carboxybenozotriazole (CBTA) to form a release layer. Changes of the release layer were observed with varying plating conditions, including the concentrations of the nickel sulfate, sodium molybdate, MT, and CBTA, the current density, and the plating time. The composition of the plating solution, current density, and plating time are shown in Table 1.

TABLE 1

| | Composition of plating solution (g/L) | | | | Current density (ASD) | Plating time (sec.) |
|---|---|---|---|---|---|---|
| | Nickel sulfate | Sodium molybdate | MT | CBTA | | |
| Example 1 | 50 | 60 | 1 | 1 | 3.5 | 30 |
| Example 2 | 25 | 75 | 1 | 1 | 3.5 | 30 |
| Example 3 | 70 | 40 | 1 | 1 | 3.5 | 30 |
| Example 4 | 15 | 25 | 1 | 1 | 3.5 | 30 |
| Example 5 | 70 | 90 | 1 | 1 | 3.5 | 30 |
| Example 6 | 50 | 60 | 1.5 | 0.5 | 3.5 | 30 |
| Example 7 | 50 | 60 | 0.5 | 1.5 | 3.5 | 30 |
| Example 8 | 50 | 60 | 0.2 | 0.2 | 3.5 | 30 |
| Example 9 | 50 | 60 | 3 | 3 | 3.5 | 30 |
| Example 10 | 50 | 60 | 1 | 1 | 2 | 30 |
| Example 11 | 50 | 60 | 1 | 1 | 4.5 | 30 |
| Example 12 | 50 | 60 | 1 | 1 | 5.5 | 30 |
| Example 13 | 50 | 60 | 1 | 1 | 3.5 | 15 |
| Example 14 | 50 | 60 | 1 | 1 | 3.5 | 50 |
| Example 15 | 50 | 60 | 1 | 1 | 3.5 | 70 |

Comparative Example 1

A metal alloy layer was formed on a carrier and an organic layer was formed thereon to form a conventional release layer.

Specifically, an 18 μm thick carrier copper foil was immersed in 5 wt % sulfuric acid for pickling and washed with pure water. The washed carrier foil was electroplated with a plating solution containing nickel as a first component and molybdenum as a second component (an aqueous solution containing 50 g/L nickel sulfate, 60 g/L sodium molybdate, and 50 g/L citric acid) to form a 200 nm thick alloy layer (nickel:molybdenum=60:40 (w/w)). The electroplating was performed with 5 ASD for 30 sec while maintaining a pH of ≥10.

The carrier foil on which the alloy layer was formed was washed with water and immersed in a coating solution containing 1 part by weight of sodium mercaptobenzotriazole and 99 parts by weight of pure water at 30° C. for 30 sec to form a 1-10 nm thick organic layer on the alloy layer.

Test Example 1

An ultrathin layer and a metal foil layer were formed on the release layer formed in each of Examples 1-15 by the following procedure.

1) Formation of Ultrathin Layer

An ultrathin layer was formed on the release layer. Specifically, the release layer was electroplated with an electroplating solution containing 250 g/L copper sulfate and 50 g/L sulfuric acid to form a ~1 μm thick ultrathin layer. The electroplating was performed with a current density of 3 ASD at a temperature of 25° C.

2) Formation of Metal Foil Layer

After completion of the ultrathin layer formation, the resulting laminate was put into an electroless plating bath. The laminate was subjected to electroless plating to form a 1 μm thick metal foil (copper foil) on the release layer. An electroless plating solution containing 190-200 g/L $CuSO_4 \cdot 5H_2O$ as a metal ion source, 0.01-0.1 g/L guanine as a nitrogenous compound, 405-420 g/L potassium sodium tartrate as a chelating agent, NaOH as a pH adjusting agent, and 28% formaldehyde as a reducing agent was used for the electroless plating. The electroless plating was performed at 30° C. for 10 min.

The adhesiveness and peel strength of the metal foil were evaluated by the following procedure.

A kraft paper and a SUS plate were laminated in this order on the metal foil (on which the single release layer was formed) and pressed under vacuum at a pressure of 3.5 MPa and a temperature of 200° C. for 100 min to prepare a laminate.

After removal of the kraft paper and the SUS plate from the laminate through the release layer, the peel strength between the carrier copper foil (on which the single release layer was formed) and the ultrathin layer was measured by the IPC-TM-650 test method (BMSP-90P Peel tester, Test speed: 50 mm/min).

The thicknesses of the release layers formed under different conditions in Examples 1-15 are shown in Table 2.

TABLE 2

| | Peel strength (gf/cm) | Thickness (nm) |
|---|---|---|
| Example 1 | 14.7 | 201 |
| Example 2 | 8.4 | 226 |
| Example 3 | 11.4 | 218 |
| Example 4 | 41.4 | 125 |
| Example 5 | 4.1 | 318 |
| Example 6 | 11.2 | 218 |
| Example 7 | 10.1 | 199 |
| Example 8 | 3.5 | 98 |
| Example 9 | 52.8 | 359 |
| Example 10 | 19.1 | 108 |
| Example 11 | 10.9 | 318 |
| Example 12 | 6.8 | 481 |
| Example 13 | 19.8 | 84 |
| Example 14 | 9.1 | 455 |
| Example 15 | 4.4 | 1046 |
| Comparative Example 1 | 15.1 | 251 |

As can be seen from the results in Table 2, the release layer of Example 1 had an appropriate peel strength and a thickness of ~200 nm. Particularly, the physical properties of the release layer of Example 1 were not substantially different from those of the conventional release layer of Comparative Example 1 and the formation of the release layer in a single step in Example 1 greatly contributed to cost and time saving.

Test Example 2

A test was conducted to determine whether residue was left after peeling off the release layers of Example 1 and Comparative Example 1. 100 specimens (size=5 cm×5 cm) were prepared in the same manner as in Test Example 1. After peeling, a visual observation was made as to whether or not residue remained on the surface of each metal foil.

TABLE 3

|  | Number of specimens where residue remained |
|---|---|
| Example 1 | 1 |
| Example 2 | 2 |
| Example 3 | 1 |
| Example 4 | 1 |
| Example 5 | 3 |
| Example 6 | 6 |
| Example 7 | 8 |
| Example 8 | 9 |
| Example 9 | 4 |
| Example 10 | 2 |
| Example 11 | 3 |
| Example 12 | 2 |
| Example 13 | 2 |
| Example 14 | 1 |
| Example 15 | 2 |
| Comparative Example 1 | 11 |

As can be seen from the results in Table 3, less residue remained in the specimens prepared using the release layers of Examples 1-5 than in the specimens prepared using the conventional release layer of Comparative Example 1.

Test Example 3

TOF-SIMS analysis was performed to compare the components contained in the release layers Example 1 and Comparative Example 1. TOF-SIMS is a method in which the surface of an analyte is sliced to certain thicknesses and the components of the sliced layers are analyzed. TOF-SIMS is an analysis method for observing compositions at different thicknesses of the analyte. FIGS. 6 and 7 show the results of TOF-SIMS analysis for the release layers of Example 1 and Comparative Example 1, respectively. As shown in FIG. 7, the content of the organic compound in the release layer of Comparative Example 1, which consisted of the alloy layer and the organic layer, decreased with increasing depth of the release layer. That is, the composition of the release layer of Comparative Example 1 varied depending on the depth of the release layer, demonstrating non-uniformity of the release layer. As shown in FIG. 6, no substantial changes were observed in the composition of the release layer of Example 1 depending on the depth of the release layer, demonstrating even distribution of the components in the single layer.

EXPLANATION OF REFERENCE NUMERALS

100: Metal foil
10: Projection
11: Protrusion
11a: Microprojection
12: Plateau

The invention claimed is:

1. A single release layer for a metal foil with carrier designed for easy removal of the carrier, the single release layer comprises:
   two or more nitrogenous heterocyclic compounds and two or more inorganic compounds containing at least one metal selected from the group consisting of nickel, molybdenum, cobalt, phosphorus, manganese, and iron,
   wherein the nitrogenous heterocyclic compounds and the inorganic compounds are dispersed throughout the thickness of the single release layer.

2. The single release layer according to claim 1, wherein the heterocyclic compounds are selected from the group consisting of: benzotriazole, mercaptobenzimidazole, mercaptobenzotriazole, sodium mercaptobenzotriazole, 5-carboxybenzotriazole, 3-amino-5-mercapto-1,2,4-triazole, 3-mercapto-1,2,4-triazole, triazole-5-carboxylic acid, 1-methyl-3-mercapto-1,2,4-triazole, and 1-phenyl-5-mercaptotetrazole.

3. The single release layer according to claim 1, wherein the inorganic compounds are selected from the group consisting of: nickel, molybdenum, cobalt, phosphorus, manganese, and iron sulfates, nitrates, phosphates, hydrochlorides, hydrofluorides, and acetates; and salts derived from nickel, molybdenum, cobalt, phosphorus, manganese, and iron oxides.

4. The single release layer according to claim 1, wherein the single release layer has a peel strength of 5 to 50 gf/cm, as evaluated by the IPC-TM-650 test method.

5. The single release layer according to claim 1, wherein the single release layer has a thickness of 100 nm to 1 µm.

6. A metal foil with carrier comprising the single release layer according to claim 1.

7. The metal foil with carrier according to claim 6, wherein the metal foil with carrier comprises a carrier, the single release layer according to claim 1 formed on the carrier, and a metal layer formed on the single release layer wherein the metal layer comprises a metal foil having a plurality of flat-topped projections.

8. The metal foil with carrier according to claim 7, wherein the metal layer comprises a thin layer which is formed on the single release layer by electroplating and the metal foil which is formed on the thin layer.

* * * * *